United States Patent
Riepen et al.

(10) Patent No.: US 10,216,095 B2
(45) Date of Patent: Feb. 26, 2019

(54) IMMERSION LITHOGRAPHIC APPARATUS

(71) Applicant: ASML Netherlands B.V., Veldhoven (NL)

(72) Inventors: Michel Riepen, Veldhoven (NL); Christianus Wilhelmus Johannes Berendsen, Roermond (NL); Anton Alexander Darhuber, 's-Hertogenbosch (NL); Hubertus Mattheus Joseph Maria Wedershoven, Veldhoven (NL); Josephus Catharina Henricus Zeegers, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/911,452

(22) PCT Filed: Jul. 22, 2014

(86) PCT No.: PCT/EP2014/065699
§ 371 (c)(1),
(2) Date: Feb. 10, 2016

(87) PCT Pub. No.: WO2015/028202
PCT Pub. Date: Mar. 5, 2015

(65) Prior Publication Data
US 2016/0195821 A1    Jul. 7, 2016

(30) Foreign Application Priority Data
Aug. 30, 2013  (EP) .................................. 13182414

(51) Int. Cl.
*G03B 27/42*   (2006.01)
*G03B 27/52*   (2006.01)
*G03F 7/20*    (2006.01)

(52) U.S. Cl.
CPC ................ *G03F 7/70341* (2013.01)

(58) Field of Classification Search
CPC ............. G03F 7/70341; G03F 7/70716; G03F 7/2041; G03F 7/70875; G03F 7/707; G03F 7/70891; G03F 7/2028; H01L 21/67034
See application file for complete search history.

(56) References Cited

U.S. PATENT DOCUMENTS 6,952,253 B2    10/2005  Lof et al.
7,701,550 B2    4/2010   Kemper et al.
(Continued)

FOREIGN PATENT DOCUMENTS

DE    221 563       4/1985
JP    2007-519238   7/2007
(Continued)

OTHER PUBLICATIONS

International Search Report and Written Opinion dated Oct. 8, 2014 in corresponding International Patent Application No. PCT/EP2014/065699.

(Continued)

*Primary Examiner* — Mesfin T Asfaw
(74) *Attorney, Agent, or Firm* — Pillsbury Winthrop Shaw Pittman, LLP (57) ABSTRACT

An immersion lithographic apparatus is configured to subject a photosensitive layer on a substrate to a patterned beam of radiation via a liquid. The immersion lithographic apparatus includes a moveable object having a surface, a fluid handling system to control a presence of the liquid in a volume restricted by the surface, the fluid handling system, and a free surface of the liquid, the free surface extending between the surface and the fluid handling system; and a heating system configured to locally heat a portion of the (Continued)

liquid at a receding side of a periphery edge of the volume in contact with the surface, where the object is receding from the volume along a direction of movement of the object relative to the fluid handling system.

20 Claims, 5 Drawing Sheets

(56) References Cited

U.S. PATENT DOCUMENTS

| | | | |
|---|---|---|---|
| 7,705,962 | B2 | 4/2010 | Kemper et al. |
| 7,751,027 | B2 | 7/2010 | Jacobs et al. |
| 7,804,575 | B2 | 9/2010 | Cadee et al. |
| 7,903,232 | B2 | 3/2011 | Leenders et al. |
| 8,345,218 | B2 | 1/2013 | Riepen et al. |
| 8,351,018 | B2 | 1/2013 | Direcks et al. |
| 8,405,815 | B2 | 3/2013 | Philips et al. |
| 8,421,993 | B2 | 4/2013 | Direcks et al. |
| 8,451,423 | B2 | 5/2013 | Janssen et al. |
| 8,547,523 | B2 | 10/2013 | Riepen et al. |
| 8,614,784 | B2 | 12/2013 | Riepen et al. |
| 8,634,053 | B2 | 1/2014 | Riepen et al. |
| 8,638,417 | B2 | 1/2014 | Philips et al. |
| 8,953,142 | B2 | 2/2015 | Kemper et al. |
| 9,069,262 | B2 | 6/2015 | Cortie et al. |
| 9,235,138 | B2 | 1/2016 | Cortie et al. |
| 2004/0207824 | A1 | 10/2004 | Lof et al. |
| 2006/0033898 | A1 | 2/2006 | Cadee et al. |
| 2006/0038968 | A1 | 2/2006 | Kemper et al. |
| 2006/0158627 | A1 | 7/2006 | Kemper et al. |
| 2006/0197930 | A1 | 9/2006 | Kawashima et al. |
| 2007/0070315 | A1 | 3/2007 | Jacobs et al. |
| 2007/0243697 | A1 | 10/2007 | Leenders et al. |
| 2008/0088843 | A1 | 4/2008 | Shibazaki |
| 2008/0212046 | A1 | 9/2008 | Riepen et al. |
| 2009/0279060 | A1 | 11/2009 | Direcks et al. |
| 2009/0279062 | A1 | 11/2009 | Direcks et al. |
| 2009/0279063 | A1 | 11/2009 | Riepen et al. |
| 2009/0316121 | A1 | 12/2009 | Janssen et al. |
| 2010/0045950 | A1 | 2/2010 | Kemper et al. |
| 2010/0134769 | A1 | 6/2010 | Mulkens et al. |
| 2010/0313974 | A1 | 12/2010 | Riepen et al. |
| 2011/0013158 | A1 | 1/2011 | Philips et al. |
| 2011/0090472 | A1 | 4/2011 | Riepen et al. |
| 2011/0255062 | A1 | 10/2011 | Philips et al. |
| 2012/0113402 | A1* | 5/2012 | Cadee ............... G03F 7/70341 355/30 |
| 2012/0120376 | A1 | 5/2012 | Bessems et al. |
| 2013/0016332 | A1 | 1/2013 | Cortie et al. |
| 2013/0016333 | A1 | 1/2013 | Cortie et al. |
| 2013/0045447 | A1 | 2/2013 | Kunnen et al. |

FOREIGN PATENT DOCUMENTS

| | | |
|---|---|---|
| JP | 2007-227725 | 9/2007 |
| JP | 2010-003985 | 1/2010 |
| JP | 2012-129558 | 7/2012 |
| JP | 2012-138630 | 7/2012 |
| WO | 2005/017491 | 8/2005 |

OTHER PUBLICATIONS

B. Reisfeld et al., "Nonlinear stability of a heated thin liquid film with variable viscosity," Phys. Fluids A, vol. 2, No. 11, pp. 2066-2067 (Nov. 1990).

Satish G. Kandlikar et al., "Experimental Study of Heat Transfer in an Evaporating Meniscus on a Moving Heated Surface," Transactions of the ASME, vol. 127, pp. 244-252 (Mar. 2005).

Hao Wang et al., "An Analytical Solution for the Total Heat Transfer in the Thin-Film Region of an Evaporating Meniscus," International Journal of Heat and Mass Transfer, vol. 51, pp. 6317-6322 (Jul. 27, 2008).

Anton A. Darhuber et al., "Planar digital nanoliter dispensing system based on thermocapillary actuation," Lab Chip, vol. 10, pp. 1061-1071 (Feb. 3, 2010).

Novacentrix, http://www.novacentrix.com/products/pulseforge, Pulseforge® Tools for Printed Electronics, 1 page (Downloaded Feb. 10, 2016).

Japanese Office Action dated Dec. 26, 2016 in corresponding Japanese Patent Application No. 2016-537183.

Emilie Bertrand et al., "Influence of solid-liquid Interactions on dynamic wetting: a molecular dynamics study," J. Phys. Condens. Matter, vol. 21, No. 46, pp. 1-14 (Oct. 29, 2009).

* cited by examiner

IMMERSION LITHOGRAPHIC APPARATUS

This application is the U.S. national phase entry of PCT patent application no. PCT/EP2014/065699, filed on Jul. 22, 2014, which claims the benefit of priority of European Patent Application No. 13182414.6, filed on Aug. 30, 2013.

FIELD

The present invention relates to an immersion lithographic apparatus and a method for processing an object (such as a substrate) in an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC via a projection system. This pattern can be transferred onto a target portion (e.g., comprising part of, one, or several dies) on the substrate (e.g., a silicon wafer). Transfer of the pattern is typically via imaging onto a layer of photo-sensitive material (e.g., photo-resist) provided on the substrate. In general, a single substrate will contain adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic apparatus in a liquid having a relatively high refractive index, e.g., water, so as to fill a space between a final element of the projection system and the substrate. In an example, the liquid is distilled water or ultra-pure water, although another liquid/fluid can be used. Suitable fluid may be a wetting fluid, an incompressible fluid and/or a fluid with higher refractive index than air, desirably a higher refractive index than water. Fluids, excluding gases, are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g., quartz) suspended therein, or a liquid with a nano-particle suspension (e.g., particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In an immersion lithographic apparatus, immersion fluid is handled by a fluid handling system, fluid handling device, fluid handling structure or fluid handling apparatus. The above expressions may have been referred to throughout the literature in the same field as a fluid confinement structure, an immersion hood or a shower head. In an example, the fluid handling system may supply immersion fluid and therefore be a fluid supply system. In an example, the fluid handling system may at least partly confine immersion fluid and thereby be a fluid confinement system. In an example, the fluid handling system may provide a barrier to immersion fluid and thereby be a barrier member, such as the fluid confinement structure as previously mentioned. In an example, the fluid handling system may create or use a flow of gas, for example to help in controlling the flow and/or the position of the immersion fluid relative to the substrate. The flow of gas may form a seal to confine the immersion fluid so the fluid handling structure may be referred to as a seal member; such a seal member may be the fluid confinement structure as previously mentioned. In an example, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

The throughput of the immersion lithographic apparatus is limited by its critical scan speed, which may be determined by the properties of the photo-resist or top coat on the substrate and the characteristics of the fluid. A scan speed is a relative speed of a moving object with respect to the fluid handling system. The object may be, for example (but not limited to), the substrate, a sensor mounted on a moveable table, such as a measurement table, or a top surface of the moveable table, etc. In the case of the substrate, the critical scan speed is defined as the maximum scan speed at which the substrate can be moved relative to the projection system and/or fluid handling system without losing the liquid, i.e. without compromising the confinement of the liquid. The critical scan speed may also be determined by the geometry and operating parameters of the immersion lithographic apparatus, such as the shape, size and design of the fluid handling system and scan length and the flow rate of fluids of the immersion lithographic apparatus.

Taking the substrate as an example, when the immersion lithographic apparatus operates at a scan velocity above the critical scan speed, liquid tends to be lost at a side of the substrate that is receding from the fluid handling system, i.e., the receding side of the substrate with respect to the fluid handling system. The lost liquid will typically form droplets on the substrate. The evaporation of the liquid droplets will apply a local cooling load on the substrate, resulting in local deformation of the substrate, which in turn, leads to overlay error. For the immersion lithographic apparatus, the term "overlay error" quantifies the misplacement and misorientation of the lithographically projected pattern relative to the desired location and orientation. Liquid droplets are also undesirable because un-evaporated droplets may cause bubbles in the liquid as a result of trapped ambient gas, e.g., air. The bubbles may affect imaging quality. Loss of the liquid needs to be avoided and, therefore, limits the scan speed of the immersion lithographic apparatus, in particular for more hydrophilic photo-resists, which have lower contact angles to the liquid and therefore typically requires lower scan speeds than more hydrophobic photo-resists. Similarly, a hydrophobic surface (such as a surface of the sensor mounted on the moveable table which may be illuminated through the liquid) has a higher contact angle to the liquid and therefore has a higher critical scan speed than a more hydrophilic surface. Liquid loss may also occur at crossing edges, stickers and gaps, such as a gap between an outer edge of the substrate and a substrate table that is moveable with respect to the projection system or a crossing between the substrate table and the measurement table. At this type of crossing, the contact line of the receding meniscus may get pinned at sharp edges of e.g., stickers, and often these surfaces are more hydrophilic than the photo-resist coated substrates.

SUMMARY

It has been discovered that the liquid loss of the immersion lithographic apparatus is due to viscous entrainment above a certain critical scan speed. The liquid exerts a drag force on the liquid film, which is counteracted by the capillary force due to the surface tension of the liquid. The viscous force is linearly proportional to the scan velocity and the viscosity of the liquid. At a certain velocity the viscous forces will exceed the capillary forces and liquid will be lost from the meniscus. The critical scan speed is determined by, among other things, the capillary number. The capillary number is representative of a dynamic property of a flowing liquid. The capillary number is usually denoted with "Ca" and is defined as the ratio between, on one hand, the product of the liquid's dynamic viscosity "$\mu$" and a characteristic relative speed "V" of the flowing liquid and, on the other hand, the surface tension "$\gamma$" of the liquid at the interface with ambient gas, e.g., air. The viscous forces arise from friction, both internal frictional forces between different volumes of liquids flowing with different velocities and the friction occurring at the flowing liquid's boundary at an interface of the flowing liquid with another medium (solid or another fluid: another liquid, or a gas). The surface tension is the contractive tendency of the surface of a liquid, arising out of the cohesive forces among liquid molecules, and acts across an interface of the liquid with a gas or with another fluid.

For a given magnitude of the dynamic viscosity "$\mu$" and another magnitude of the surface tension "$\gamma$", the magnitude of the critical scan speed "V_crit" is determined by the critical capillary number "Ca_crit". When the immersion lithographic apparatus is in operation, a volume of liquid is in contact with, and is moving relative to, the substrate which has a more or less flat surface. If the capillary number exceeds a certain threshold given by the critical capillary number Ca_crit, the liquid will start to shed droplets on the surface of the substrate at the receding contact line, i.e. the receding side of the volume of liquid in contact with the substrate with respect to the fluid handling system, i.e., the side where a portion of the substrate moves away (or emerges) from the underside of the fluid handling system. The same principle may apply if the flat surface is, for example, the surface of the sensor mounted on the measurement table.

It is therefore an objective of the invention to provide a way to reduce the chance of liquid droplets forming on the receding side of the object at a higher scan speed so as to increase the throughput of the immersion lithographic apparatus.

According to an aspect of the invention, there is provided an immersion lithographic apparatus, the immersion lithographic apparatus configured to subject a photo-sensitive layer on a substrate to a patterned beam of radiation via a liquid, wherein the immersion lithographic apparatus comprises:
  a moveable object having a surface;
  a fluid handling system for controlling a presence of the liquid in a volume restricted by the surface, the fluid handling system, and a free surface of the liquid, the free surface extending between the surface and the fluid handling system; and
  a heating system configured to locally heat a portion of the liquid at a receding side of a periphery edge of the volume in contact with the surface, where the object is receding from the volume along a direction of movement of the object relative to the fluid handling system.

Locally heating a portion of the liquid at the receding side of the periphery edge of the volume in contact with the surface of the object (such as the surface of the substrate), where the object (such as the substrate) is receding from the volume along a direction of movement of the object relative to the fluid handling system will cause a local reduction in liquid viscosity. Although the surface tension at that portion of the liquid also decreases due to the local heating, the relative change of the magnitude of the dynamic viscosity of the liquid is typically much larger than that of the surface tension. Accordingly, the critical scan speed, at which the object can be moved relative to the projection system and/or fluid handling system without leaving residual liquid on the object, can be increased if the viscosity is decreased.

The heating system may comprise one or more sources of electromagnetic radiation. Each respective one of the one or more sources of electromagnetic radiation is configured to generate respective electromagnetic radiation, and the respective electromagnetic radiation is configured to be absorbed predominantly by the liquid, rather than by the object (such as the substrate) and/or by the photo-sensitive layer.

Using a source of electromagnetic radiation (such as a laser) may be advantageous because the laser may potentially be a small semiconductor device which can be added to the fluid handling system and/or can be easily controlled to direct a beam of the electromagnetic radiation (such as laser radiation) to a precise location of the periphery edge of the volume. In the latter scenario, for example, an external source of electromagnetic radiation (such as a laser source) which is coupled to at least one optical fibre may be equally easy to implement. A laser source typically has a well-defined wavelength, narrow beam and potentially high power density. If using a narrow bandwidth is desired for the purpose of locally heating the liquid, an infrared high power light-emitting diode (LED) may be equally applied as a suitable source of electromagnetic radiation. In addition, the power of the source of electromagnetic radiation can be controlled to minimise total heat input and the wavelength of the source of electromagnetic radiation can be selected such that the electromagnetic radiation is absorbed primarily in the liquid and not or hardly in the object (such as the substrate), thereby reducing the heat load on the substrate.

At least a particular one of the one or more sources of electromagnetic radiation may be mechanically coupled to, or accommodated in, the fluid handling system. This arrangement is beneficial because it may require fewer parts (such as in a cable slab) in the substrate table/support that is moveable with respect to the fluid handling system.

One or more sources of electromagnetic radiation may be arranged along a path of a polygonal shape radially outwards of a plurality of fluid outlets with respect to a central opening of the fluid handling system. The plurality of fluid outlets are arranged in an under surface of the fluid handling system and configured to extract a mixture of the liquid and gas as known in the art. Such particular shape may help ensure that the maximum scan speed is higher than if the fluid outlets were arranged along a path of a circular shape.

An additional source of electromagnetic radiation may be arranged at a corner of the polygonal shape. This arrangement may be advantageous because when the critical scan speed is exceeded, liquid loss will first occur at a corner of the polygonal shape corresponding to the receding side of the periphery edge, i.e., a receding corner. By heating the liquid at the receding corner in the stepping or scanning direction, the first possible occurrence of liquid loss at the receding side may be effectively avoided.

One or more sources of electromagnetic radiation may be arranged at an extension projecting from the under surface of the fluid handling system and arranged radially outwards of the plurality of fluid outlets with respect to the central opening of the fluid handling system. Such arrangement may be beneficial when there is limited space on the under surface of the fluid handling system.

One or more sources of electromagnetic radiation may be configured such that the receding side of the periphery edge is prevented from moving beyond the electromagnetic radiation emitting from the one or more sources of electromagnetic radiation so as to form a self-controlling heating system. The heating system may be positioned at a fixed location relative to the fluid handling system at a predetermined distance. This arrangement may be advantageous, since there is no direct need to track the position of the receding side of the periphery edge relative to the one or more sources of electromagnetic radiation and aim the one or more sources of electromagnetic radiation towards that position.

The heating system may comprise a heating element, a reflector and a filter. The heating element may be configured to provide electromagnetic radiation. The reflector may be shaped and configured to reflect almost all heat generated by the heating element towards the liquid. The filter may be configured such that the electromagnetic radiation emitting from the heating element through the filter primarily heats up the liquid and not the object (such as the substrate) and/or the photo-sensitive layer. Using a heating element may be advantageous because heating along a line instead of a spot may be implemented more compactly as compared to using a laser with lenses. In addition, including a reflector and a filter may further increase design flexibility for the heating system.

Alternatively or additionally, at least a particular one of the one or more sources of electromagnetic radiation may be coupled to or accommodated in a support configured to support the object. This is beneficial if there is limited space in the fluid handling system.

Additional one or more sources of electromagnetic radiation may be arranged around the perimeter of the object to supply additional heat to the liquid so as to avoid liquid loss at a gap formed between an outer edge of the object and a substrate table supporting the support. This arrangement may be advantageous because at such crossing or transition, the receding side of the periphery edge may get pinned at sharp edges and often these surfaces are more hydrophilic than the photo-resist coated substrates.

At least a specific one of the one or more sources of electromagnetic radiation is controllable with respect to at least one of:

an intensity of the electromagnetic radiation generated by the specific source of electromagnetic radiation;

a direction of the electromagnetic radiation, generated by the specific source of electromagnetic radiation, relative to a reference direction substantially perpendicular to the substrate;

a duty cycle of a pulsed mode operation of the specific source of electromagnetic radiation; and a size of an area of the periphery edge illuminated by the electromagnetic radiation generated by the specific source of electromagnetic radiation.

A source of electromagnetic radiation with a controllable intensity may be beneficial because possible heat loads applied to the object may be controlled. For example, by minimising the electromagnetic radiation intensity for the desired reduction of viscosity, the possible heat load on the object may be minimised. Having a direction of the electromagnetic radiation generated by a specific source of electromagnetic radiation controllable may facilitate to easily guide and direct the beam(s) of the electromagnetic radiation to a precise location of the periphery edge of the volume. The same is true if the source of electromagnetic radiation is controllable with respect to a size of an area of the periphery edge illuminated by the electromagnetic radiation generated by the specific source of electromagnetic radiation. A source of electromagnetic radiation that is controllable with respect to a duty cycle of a pulsed mode operation of the specific source of electromagnetic radiation enables such specific source of electromagnetic radiation to adjust the duration of exposure time to a desired length so that the heat load on the periphery edge of the volume and the object is optimised and/or minimised. Using duty cycle control may typically be a more linear way to control the laser intensity than using laser power control.

More specifically, the source of electromagnetic radiation may be configured to emit a pulsed mode illumination. This may optimise the effect, such as the effect of heat transport by conduction to other parts of the object or the liquid, on the periphery edge of the volume without affecting the heat load of the object, because the heat is present for a short time.

Alternatively or additionally, the heating system may be configured to provide a heated gas jet from the under surface of the fluid handling system in a region of the receding side of the periphery edge, the under surface facing the object. As already known in a conventional fluid handling system, a gas knife, which is located on the under surface of the fluid handling system, has been used to confine the volume of the liquid. It may therefore be feasible to provide a heated gas jet, for example, from the gas knife. For a fluid handling system which employs a gas knife, it may be preferable to use $CO_2$ to mitigate bubble defects occurring at edges of the object. The term "bubble defects" refers to lithographic projection defects due to the presence of gas bubbles in the immersion fluid. The gas bubbles have a different refractive index than the fluid and have a lens effect that causes distortions of the lithographically projected patterns relative to the designed patterns. The advantage of a combination of a heating system with the gas knife could be that the gas knife reduces the liquid film thickness, thereby reducing the required heating power on the liquid film at the receding side.

The immersion lithographic apparatus may further comprise a detector configured to detect a location of the receding side of the periphery edge. The detection may provide useful information concerning, for example, a precise location of the periphery edge at which to direct the heat, or the required or optimal electromagnetic radiation intensity or duty cycle to be used to generate the minimal amount of heat to other areas.

Additionally, the immersion lithographic apparatus may further comprises a controller configured to activate the heating system in response to a detecting signal from the detector, the signal being representative of the detector having detected the location of the receding side of the periphery edge. This may ensure that the beam of the electromagnetic radiation is focused on an optimal or precise location without causing unnecessary heat load to other areas.

Alternatively, the fluid handling system may be configured such that a heated liquid is locally supplied to a proximity of the periphery edge. Possible benefit of using the locally heated liquid would be that no electromagnetic radiation source is required and thus no beam delivery system and no related control system of any kind are needed.

According to an aspect of the invention, there is provided a method for processing an object in an immersion lithographic apparatus, comprising the steps of:

subjecting a photo-sensitive layer on a substrate to a patterned beam of radiation via a liquid;

controlling a presence of the liquid in a volume restricted by a surface of the object, a fluid handling system, and a free surface of the liquid, the free surface extending between the surface and the fluid handling system; and locally heating a portion of the liquid at a receding side of a periphery edge of the volume in contact with the surface, where the object is receding from the volume along a direction of movement of the object relative to the fluid handling system.

The benefits of locally heating a portion of the liquid at the receding side of the periphery edge have been described in the previous paragraphs.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
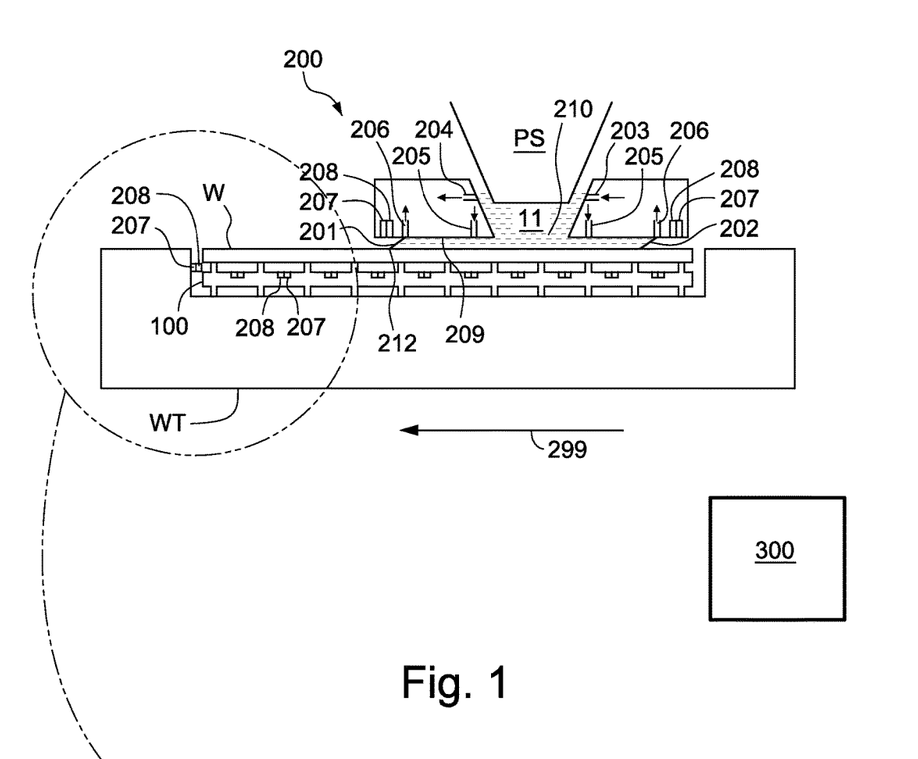
FIG. 1 is a schematic drawing depicting a part of an immersion lithographic apparatus according to an embodiment of the invention.

FIG. 1 schematically depicts a part of an immersion lithographic apparatus according to an embodiment of the invention and in cross-section, the depicted part being a part of a fluid handling system 200. A conventional immersion lithographic apparatus, which is configured to subject a photo-sensitive layer (such as a photo-resist) on a moveable object having a surface, e.g., substrate W, to a patterned beam of radiation via a liquid, is disclosed, e.g., in United States patent application publication no. US 2013045447, the contents of which are hereby incorporated in their entirety by reference. A conventional fluid handling system is disclosed in, for example, United States patent application publication nos. US 2004207824, US 2006038968, US 2006158627, US 2008212046, US 2009279060, US 2009279062, US 2009279063, US2010045950, US 2010313974, US 2011013158, US 2011090472, US 2011255062, US 2012120376, US 2013016332 and US 2013016333, the contents of which are hereby incorporated in their entirety by reference.

The fluid handling system 200 is configured to control a presence of the liquid in a volume 11 which is restricted by the moveable object having the surface, the fluid handling system 200, and a free surface 201, 202 of the liquid. In this example, the moveable object is the substrate W. The object may be, for example (but not limited to), a sensor mounted on a moveable table, such as a measurement table MST (see FIG. 6 or 7) or a top surface of the moveable table, etc., as will described in more details later. The free surface 201, 202 extends between the surface of the substrate W and the fluid handling system 200. The liquid is provided to the volume 11 mainly by openings 203, 204. The direction of a flow of the liquid from the openings 203, 204 may depend on a scanning direction of the substrate W (depicted by an arrow 299) or be independent of the scanning direction. In the example of FIG. 1, the liquid is provided through the opening 203 and extracted from the opening 204, i.e., the direction of the flow of the liquid is opposite to the scanning direction. The direction of liquid flow from the openings 203, 204 may reverse when the scanning direction of the substrate W reverses.

Figure 2:
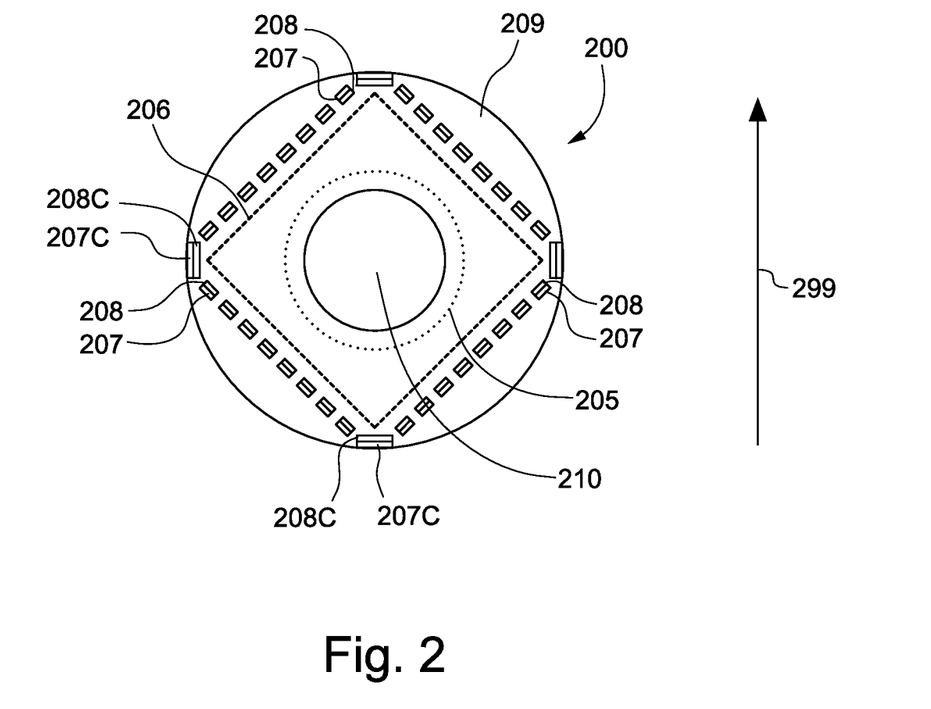
FIG. 2 depicts a bottom view of a fluid handling system in FIG. 1.

FIG. 2 depicts a bottom view of the fluid handling system 200 in FIG. 1. A central opening 210 formed on an under surface 209 of the fluid handling system 200 faces the substrate W in operational use of the fluid handling system 200. The central opening 210 is circular to accommodate a circular cross-section of a part of the projection system PS, e.g., the final element of the projection system PS, perpendicular to an optical axis of the projection system PS. A series of liquid outlets 205 forms a shape along a circular path and is arranged radially outwards of the central opening 210. The shape of the path is not limited to a circular shape and may be of other shape, for example, a square, polygonal or elliptical shape. The liquid outlets 205 provide the liquid out of the fluid handling system 200 and may be considered as liquid supply inlets to provide the liquid into the volume 11. The liquid flowing out of the liquid outlets 205 is directed towards the substrate W. This type of outlets 205 has been conventionally provided in order to reduce the chances of bubbles being generated in the liquid because of gas trapped in a gap between an edge of the substrate W and a substrate table WT.

A plurality of fluid outlets 206 are arranged along a path of a polygonal shape (e.g., square) radially outwardly of the liquid outlets 205 with respect to the central opening 210 in the under surface 209 of the fluid handling system 200. The path of the fluid outlets 206 may be arranged along a rhombus shape or any other shape, for example, a circular shape, although the square shape or the rhombus shape helps ensure that the critical scan speed is higher than if the fluid outlets 206 were arranged along a path of a circular shape. The fluid outlets 206 may be regarded as fluid extraction outlets. Each fluid outlet 206 has, in plan, a maximum cross-sectional dimension, such as a diameter in case of a circular fluid outlet 206, perhaps with a maximum dimension of preferably about 0.35 mm (e.g. 0.25 mm square) or of greater than 0.5 mm, greater than 1 mm. It should be noted that the maximum dimension of each fluid outlet 206 should be selected so that it does not generate bubbles as a result of flow instabilities in each fluid outlet 206. Because of their relatively larger dimension compared with that of pores of a porous member which exists in some conventional fluid handling system, the fluid outlets 206 are unlikely to be affected much by contamination.

Each of the plurality of the fluid outlets 206 may be connected to an individual under-pressure source. Alternatively or additionally, each of the plurality of the fluid outlets 206 may be connected to a common chamber (which may be annular) which is itself held at an under-pressure. In this way a uniform under-pressure at each or a plurality of the fluid outlets 206 may be achieved. The fluid outlets 206 may be connected to a vacuum source. Alternatively or additionally, the atmosphere, e.g., of air, surrounding the fluid handling system 200 may be increased in pressure to generate the required under-pressure.

Each fluid outlet 206 is configured to extract a mixture of liquid and gas, for example in a two-phase flow. The liquid is extracted from the volume 11, whereas the gas is extracted from the atmosphere on the other side of a boundary between the atmosphere and the volume 11. This creates a gas flow towards the fluid outlets 206. This gas flow is effective to pin a meniscus between the fluid outlets 206, for example between neighbouring one of the fluid outlets 206, with drag (shear) forces induced by gas flow into the fluid outlets 206 and/or by a gas flow induced pressure gradient. Due to relative movement between the substrate W and the fluid handling system 200 (scanning or stepping), at the boundary between the volume 11 and the atmosphere, a free surface 201 is formed between the substrate W and the fluid handling system 200 at a side that is receding from the fluid handling system 200, i.e., at a receding side of the substrate W, where the substrate W is receding from the volume 11 along a direction of movement of the substrate W relative to the fluid handling system 200, such as the scanning direction of the substrate W (arrow 299) or the stepping direction, i.e., the side where a portion of the substrate W moves away (or emerges) from the underside of the fluid handling system. In addition, a free surface 202 is formed between the substrate W and the fluid handling system 200 at a side that is advancing towards the fluid handling system 200, i.e., at an advancing side of the substrate W, where the substrate W is advancing towards the volume 11 along the direction of movement of the substrate W relative to the fluid handling system 200, such as the scanning direction of the substrate W (arrow 299) or the stepping direction, i.e., the side where the other portion of the substrate W moves towards the underside of the fluid handling system 200. In other words, the direction of the scanning direction of the substrate W (arrow 299) is from the advancing side towards the receding side.

In order to reduce the chance of liquid droplets forming on the receding side of the substrate W at a higher scan speed, as shown in FIG. 1, the immersion lithographic apparatus comprises a heating system 207. The heating system 207 is configured to locally heat a portion of the liquid at a receding side of a periphery edge of the volume 11 in contact with the substrate W, where the substrate W is receding from the volume 11 along the direction of movement of the substrate W relative to the fluid handling system 200, such as the scanning direction of the substrate W (arrow 299) or the stepping direction, i.e., a receding contact line 212 of the volume 11 with the substrate W with respect to the fluid handling system 200. As described in previous paragraphs, locally heating a portion of the liquid at the receding contact line 212 of the volume 11 with the substrate W will cause a local reduction in liquid viscosity. A liquid having a lower viscosity can flow at a higher velocity than one with a higher viscosity without leaving residual liquid droplets behind.

As described in the previous paragraphs, the capillary number "Ca" is representative of a dynamic property of a flowing liquid and is defined as the ratio between, on one hand, the product of the liquid's dynamic viscosity "$\mu$" and a characteristic relative speed "V" of the flowing liquid, and, on the other hand, the surface tension "$\gamma$" of the liquid at the interface. Although the surface tension "$\gamma$" at that portion of the liquid also decreases due to the local heating, the relative change of the magnitude of the dynamic viscosity "$\mu$" of the liquid is typically much larger than that of the surface tension "$\gamma$". For a given capillary number "Ca", this will enable the immersion lithographic apparatus to increase the maximum scan speed "V_max" at which the substrate W can be moved relative to the projection system PS and/or fluid handling system 200 before droplets of the liquid start to get shed at the receding side. In view of the Molecular-Kinetics Theory, as described in "E. Bertrand, T. D. Blake and J. De Coninck, J. Phys.: Condens. Matter 21 (2009) 464124", with a decrease of viscosity and increase in temperature, the movement of molecules near the contact line will be enhanced, thereby decreasing the contact line friction near the receding contact line 212 and increasing the contact line mobility. This has been discussed in the same paper. In addition, if the surface tension "$\gamma$" is reduced locally as a result of local heating, there will be a gradient in the surface tension along the periphery edge of the volume 11 in contact with the substrate W at the receding side of the substrate W. Such gradient may help pull the liquid back to the volume 11 and therefore may assist the liquid at the receding side of the substrate W in retreating. This may further enhance stability of the liquid in the volume 11 and reduce the chance of forming liquid droplets at the receding side of the substrate W, therefore enables the immersion lithographic apparatus to increase the maximum scan speed "V_max" at which the substrate W can be moved relative to the projection system PS and/or fluid handling system 200.

In an embodiment, the heating system 207 comprises one or more sources of electromagnetic radiation (such as lasers or laser sources) or other suitable sources of radiation. Each respective one of the one or more sources of electromagnetic radiation is configured to generate respective electromagnetic radiation. In the case of using a laser, this could, for example, be achieved by means of a diode laser. Other suitable lasers for the purpose of the heating system 207 may be (but not limited to), for example, a gas or liquid filled cavity laser, etc. Those lasers are well known in the industry. As described previously, laser sources typically have a well-defined wavelength, narrow beam and potentially high power density. Again, using the laser may be advantageous because the laser may potentially be a small semiconductor device which can be fitted to the fluid handling system 200 and/or can be easily controlled to direct a beam of laser radiation (or laser beam) to a precise location of the receding contact line 212 without heating other parts of the substrate W and/or the liquid. Alternatively, electromagnetic radiation (such as laser radiation) may be provided by using at least one optical fibre or other waveguide coupled to an external source of electromagnetic radiation (such as an external laser source). In an embodiment, the electromagnetic radiation is configured to be absorbed predominantly by the liquid, rather than by the substrate W and/or by its photo-sensitive layer. For example, the wavelength "λ" of the electromagnetic radiation may be selected such that the radiation is absorbed primarily in the liquid and not or hardly in the substrate W (which is usually made of silicon) and/or in the photo-resist. This has the advantage of reducing the heat load on the substrate W. For example, the electromagnetic radiation may be infrared light.

As shown in FIGS. 1 and 2, in an embodiment, at least a particular one of the one or more sources of electromagnetic radiation of the heating system 207 is mechanically coupled to or accommodated (fitted) in or at the fluid handling system 200. In the case of using the laser as a source of electromagnetic radiation, the laser may be positioned in or at the under surface 209 of the fluid handling system 200 facing the substrate W. In an embodiment, a plurality of the lasers may be arranged radially outwards of the fluid outlets 206 and generally follow the shape formed by the fluid outlets 206 with respect to the central opening 210, i.e., the plurality of lasers surround the plurality of fluid outlets 206. This will ensure that the contact line of the volume 11 with the substrate W can be locally heated by the electromagnetic radiation emitting from the one or more lasers when the substrate W is moving in any of the scanning direction and stepping directions so that when the immersion lithographic apparatus operates in the stepping direction, the receding contact line 212 of the volume 11 with the substrate W may be locally heated by the electromagnetic radiation. This will increase the maximum step speed along the stepping direction and thus improve throughput.

Figure 3A:
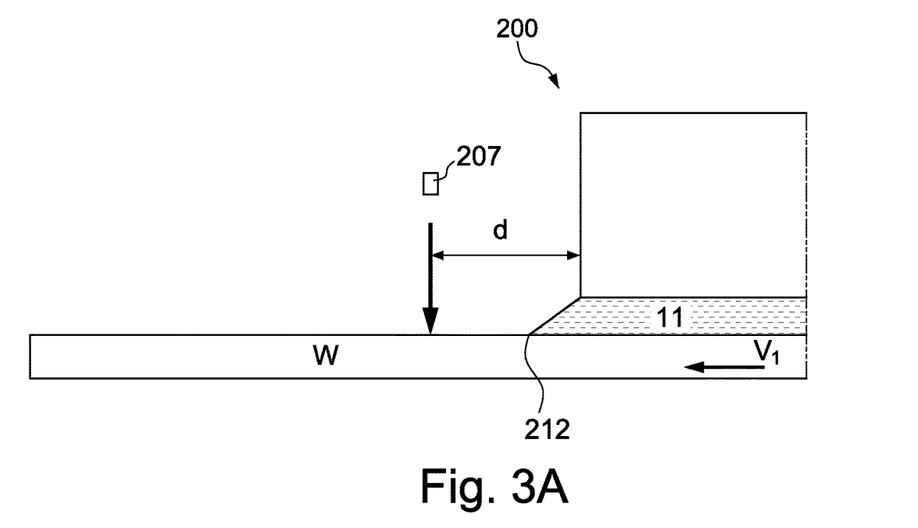
FIGS. 3A and 3B are schematic drawings depicting an alternative heating system for use in the part of the part of the immersion lithographic apparatus of FIG. 1 according to an embodiment of the invention.
Figure 3B:
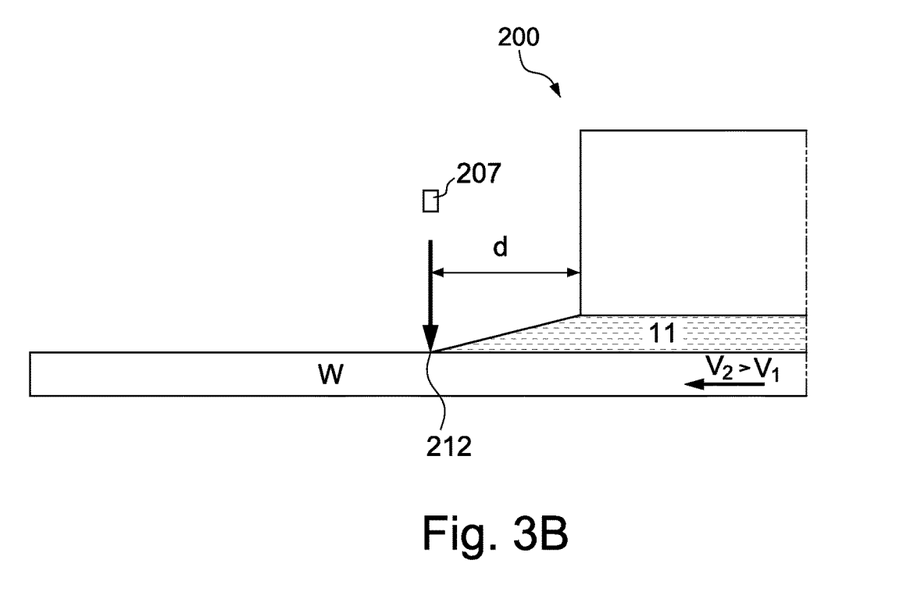

In an embodiment, the heating system 207 may comprise one or more sources of electromagnetic radiation which may be configured such that the receding contact line 212 is prevented from moving beyond the electromagnetic radiation emitting from the one or more sources of electromagnetic radiation. As shown in FIGS. 3A and 3B, the heating system 207 (or the electromagnetic radiation emitted from the heating system 207) is positioned at a fixed location relative to the fluid handling system 200 at a predetermined distance d. At a certain subcritical substrate speed V1, the receding contact line 212 has a certain position relative to the heating system 207 (or the electromagnetic radiation), which is smaller than the distance d (see FIG. 3A). If the speed of the substrate W increases, the position of the receding contact line 212 moves closer to the position of the heating line formed by the one or more of sources of electromagnetic radiation. At a certain speed V2, the receding contact line 212 reaches the heating line and absorbs (a part of) its electromagnetic radiation (see FIG. 3B), which in turn, increases the contact line mobility as described previously. Such heating allows an increase of the critical scan speed towards a value V_crit_new that depends on the laser power among other things. In this fashion the mobility of the receding contact line 212 is locally increased at the heating line for speeds V, where V2<V<V_crit_new, such that the heated receding contact line 212 maintains the other certain position relative to the heating system 207, which is also smaller than the distance d. In other words, the heating line formed by the plurality of lasers acts like a "fence" and prevents the receding contact line 212 from moving beyond the heating line. This effect may form a self-controlling heating system which may be advantageous, since there is no direct need to track the position of the receding contact line 212 relative to the one or more sources of electromagnetic radiation and aim the one or more sources of electromagnetic radiation towards that position.

Preferably, in an embodiment, the heating system 207 may comprise sources of electromagnetic radiation positioned at each corner of the polygonal shape as shown in FIG. 2. In the following, these sources are referred to as "corner sources" 207C. This arrangement may be advantageous because when the critical scan speed is exceeded, liquid loss will first occur at a corner of the receding side of the polygonal shape, i.e., a receding corner, corresponding to the receding contact line 212. By heating the liquid at the receding corner in the stepping or scanning direction, the first possible occurrence of liquid loss at the receding contact line 212 may be effectively avoided. This alone may be enough to increase the maximum scan speed and thus reduce the need to heat another part of the receding contact line 212.

In an embodiment, the heating system 207 may be arranged such that a plurality of rows of sources of electromagnetic radiation are arranged radially outwards of the fluid outlets 206 and generally follow the shape formed by the fluid outlets 206 with respect to the central opening 210, i.e., the plurality of rows of sources of electromagnetic radiation surround the plurality of fluid outlets 206. Each of the sources of electromagnetic radiation may be individually controllable by a controller 300, as will be explained in the following paragraphs. During a scanning operation, the sources of electromagnetic radiation at the receding side of the substrate W with respect to the fluid handling system 200 may be activated while the rest of the sources of electromagnetic radiation may be deactivated. Because the power and/or wavelength of the electromagnetic radiation may be selected so as to cause little heat load on the substrate W, this arrangement may be beneficial since at least one of the plurality of rows of sources of electromagnetic radiation would eventually locally heat the precise location of the receding contact line 212 of the volume 11 with the substrate W during the movement of the substrate W relative to the fluid handling system 200, without any additional mechanism of detecting the precise location of the receding contact line 212 with respect to the fluid handling system 200. Similar operation may be repeated when the scanning direction is reversed or the immersion lithographic apparatus operates in the stepping direction.

Alternatively or additionally, the source of electromagnetic radiation may be positioned outside the fluid handling system 200. For example, at least one optical fibre (not shown in the figures) may be coupled to the external laser source at one end (not shown in the figures) and positioned in the fluid handling system 200 at the other end (see FIG. 5). The at least one optical fibre may be arranged such that the beams of the electromagnetic radiation emitting from the external source of electromagnetic radiation through the at least one optical fibre may be directed to near the receding contact line 212 of the volume 11. If there is sufficient space between the under surface 209 of the fluid handling system 200 and the substrate W, the at least one optical fibre may be actuated by the controller 300 such that the beams of the electromagnetic radiation may be directed to different locations on the substrate W. This may facilitate easy guiding and directing the electromagnetic radiation to a precise location of the receding contact line 212.

In an embodiment, similar to the heating system 207 which employs a plurality of sources of electromagnetic radiation as described previously, at least one row of the optical fibres may be arranged such that a least one row of ends of the optical fibres surrounds the plurality of fluid outlets 206 for heating the receding contact line 212 in the same manner. The source of electromagnetic radiation and the at least one row of optical fibres may be configured so as to operate as a self-controlling heating system. The at least one row of optical fibres may be coupled to a plurality of sources of electromagnetic radiation. Similarly, a respective optical fibre may be positioned at a respective corner of the polygonal shape as shown in FIG. 2 such that the beams of the electromagnetic radiation heat the liquid at the receding side where the first possible occurrence of liquid loss may occur in the absence of the heating. Again, this alone may be enough to increase the maximum scan speed compared to a configuration without the local heating and thus reduce the need to heat other parts of the receding contact line 212.

Alternatively or additionally, in an embodiment, at least a particular one of the one or more sources of electromagnetic radiation of the heating system 207 may be mechanically coupled to or accommodated (fitted) in or at a support 100 which is configured to support the substrate W. In the case of using the laser, the laser may be, for example, positioned in the support 100. The one or more lasers in the support 100 may heat the receding contact line 212 of the volume 11 with the substrate W by shining the beams of the laser radiation (or laser beams) through the substrate W, using a wavelength to which the substrate W is transparent and which the substrate W does not absorb. For example, by selecting a suitable wavelength (e.g., $\lambda=1470$ nm) of the laser radiation, the laser radiation may penetrate through the substrate W because the substrate W is sufficiently transparent to this particular wavelength. It should be noted that the wavelength of the electromagnetic radiation (such as laser radiation) should also be selected such that the electromagnetic radiation is hardly absorbed in the photo-resist and/or does not expose the photo-resist. The arrangement of having the heating system 207 in the support 100 may be beneficial if there is limited space in the under surface 209 of the fluid handling system 200 facing the substrate W, for example, similar to the embodiment of FIG. 5. In an embodiment, a plurality of mirrors may be arranged on the under surface 209 of the fluid handling system 200 radially outwards of the fluid outlets 206 (not shown in figures). Each mirror is individually controllable by the controller 300 and configured to reflect the beams of electromagnetic radiation coming from the support 100 through the substrate W. This may further facilitate easy guiding and directing the beams of the electromagnetic radiation to a precise location of the receding contact line 212 of the volume 11 with the substrate W.

Figure 1A:
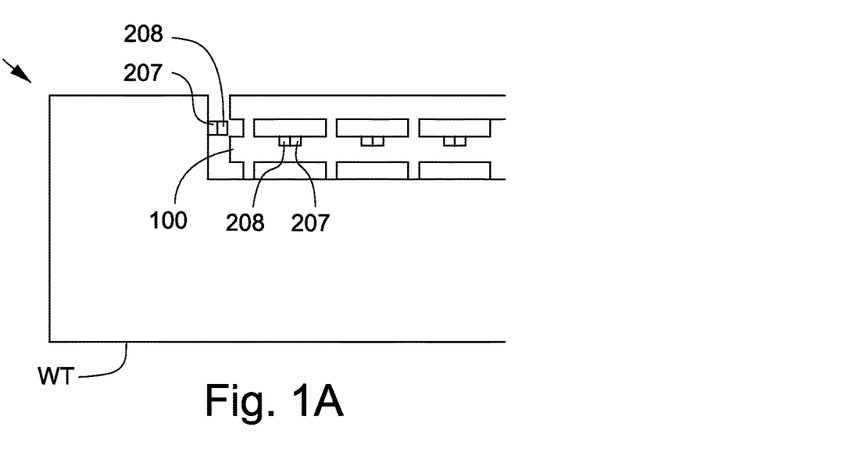
FIG. 1A is a locally enlarged view of FIG. 1 depicting a part of a support and a substrate table according to an embodiment of the invention.
Figure 6:
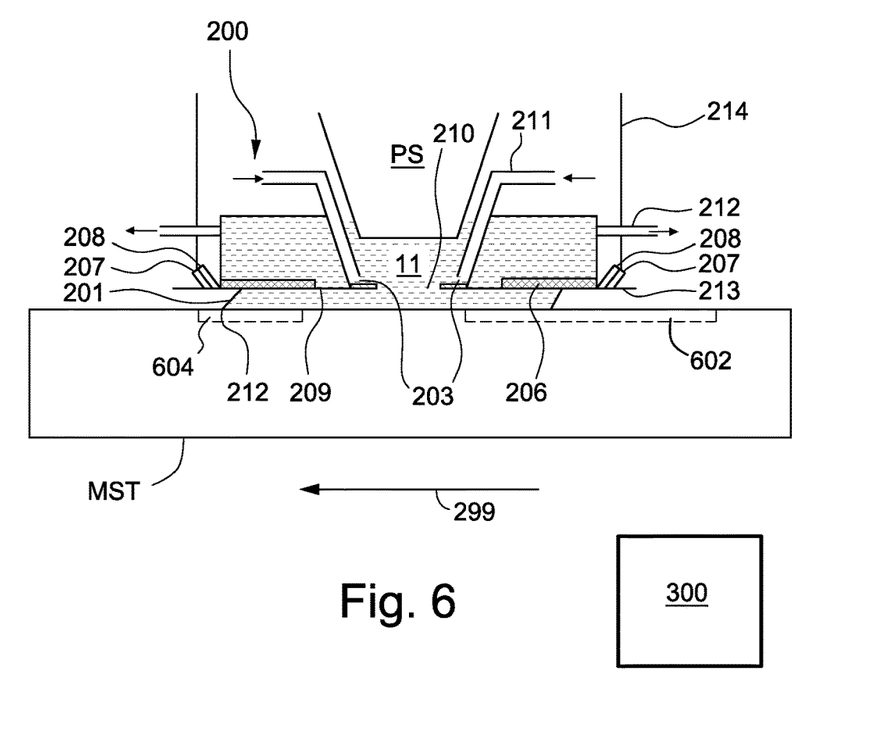
FIG. 6 is a schematic drawing depicting a part of an immersion lithographic apparatus employing a measurement table according to an embodiment of the invention.

Alternatively, as shown in FIG. 1A, the one or more sources of electromagnetic radiation in the support 100 may be arranged around the perimeter of the substrate W to supply additional heat to the liquid so as to avoid liquid loss at the substrate edge transition to the substrate table WT supporting the support 100, i.e., the gap formed between the outer edge of the substrate W (in plan view) and the substrate table WT, or at a crossing between the substrate table WT and the measurement table MST (see FIG. 6). This arrangement may be advantageous because at such crossing or transition, the receding contact line 212 (or meniscus) may get pinned at sharp edges and often these surfaces are more hydrophilic than the photo-resist coated substrates. Contact line pinning at topographical features, such as step or sharp edges, gaps, trenches etc., may cause residual droplets as a result of capillary breakup, i.e. the instability of a volume of liquid due to surface tension forces. In such case, localised heating may cause Marangoni stresses, i.e. shear stresses due to surface tension gradients caused by temperature gradients, which in turn, can be used for manipulation of the liquid distribution. The general backgrounds of the manipulation of liquid distribution by Marangoni stresses was published in "Darhuber et al., Lab Chip, 2010, 10, 1061".

In an embodiment, the heating system 207 in the support 100 may comprise at least one optical fibre coupled to the source of electromagnetic radiation (such as the external laser source as described previously). The end of the at least one optical fibre, from which the electromagnetic radiations exits, is arranged adjacent the perimeter of the substrate W similar to the embodiment of FIG. 1A. In an embodiment, a plurality of optical fibres may be coupled to a single source of electromagnetic radiation so as to distribute the electromagnetic radiation from a single source among different locations. Alternatively, the plurality of optical fibres may be coupled to a plurality of the sources of electromagnetic radiation (such as a plurality of external laser sources). The heating system 207 may operate in the same manner as described previously.

In an embodiment, at least a specific one of the one or more sources of electromagnetic radiation (such as lasers or laser sources) is controllable with respect to an intensity of the electromagnetic radiation generated by the specific source of electromagnetic radiation. Alternatively or additionally, at least a specific one of the one or more sources of electromagnetic radiation is controllable with respect to a direction of the electromagnetic radiation, generated by the specific source of electromagnetic radiation, relative to a reference direction substantially perpendicular to the substrate W. Alternatively or additionally, at least a specific one of the one or more sources of electromagnetic radiation is controllable with respect to a duty cycle of a pulsed mode operation of the specific source of electromagnetic radiation. Alternatively or additionally, at least a specific one of the one or more sources of electromagnetic radiation is controllable with respect to a size of an area of the receding contact line 212 illuminated by the electromagnetic radiation generated by the specific source of electromagnetic radiation.

In an embodiment, the beam of the electromagnetic radiation may be shaped in any pattern, such as a Gaussian focused spot, several discrete spots or a curtain of light. A curtain of light may uniformly heat the receding contact line 212. In an embodiment, a pulsed mode illumination may also be employed to minimise the required source power to achieve a certain temperature increase at the receding contact line 212 and thus to minimise the transport of heat by conduction to other parts of the substrate W and/or the liquid. By minimising the time that the source of electromagnetic radiation is on compared with the time the source of electromagnetic radiation is off, the temperature at the liquid-air interface of the liquid (if the electromagnetic radiation is incident from the gas phase) or at the solid-liquid interface (if the electromagnetic radiation is incident in transmission through a transparent substrate W) can be made substantially higher than the temperature deeper within the liquid, if the liquid absorbs the electromagnetic radiation strongly. The surface of the receding contact line 212 can then be heated while heat penetration into the substrate W or the bulk of the liquid is minimised. The technique of using very short and very intense radiation pulses to minimise substrate heating has been widely used in commercially available systems for sintering metal nano-particle coatings on heat-sensitive substrates (e.g. "Pulseforge" from Novacentrix, see http://www.novacentrix.com/products/pulseforge). In the example of using the pulsed mode illumination, a practical range of the required power of the source(s) of electromagnetic radiation would be approximately 10-20 W for a typical fluid handling system.

In an embodiment, for example, the one or more sources of electromagnetic radiation may be coupled to the controller 300 of the immersion lithographic apparatus. The controller 300 may determine any or all of the above mentioned parameters (such as the intensity of the electromagnetic radiation, the direction of the electromagnetic radiation, the duty cycle of a pulsed mode operation of the source(s) of electromagnetic radiation, and the size of the area of the receding contact line 212 illuminated by the electromagnetic radiation, etc.) based on (but not limited to) different factors such as the type of photo-resist, top coat or other properties of the substrate W, or a precise location of the receding contact line 212 of the volume 11 with respect to the fluid handling system 200. A look-up table may store information of, for example, the type of photo-resist, top coat or other properties of the substrate W, or a precise location of the receding contact line 212 of the volume 11 with respect to the fluid handling system 200, and the corresponding parameters. In the cases of the direction of the electromagnetic radiation or the size of the area of the receding contact line 212 illuminated by the electromagnetic radiation, a control loop such as a feedback loop may be used such that the controller 300 controls the direction of the electromagnetic radiation in response to signals which indicate the location of the receding contact line 212 of the volume 11 with respect to the fluid handling system 200. This will be described in more details. Alternatively or additionally, a feed-forward control loop may be used if a precise location of the receding contact line 212 of the volume 11 with respect to the fluid handling system 200 can be predicted based on information such as the movement of the substrate W relative to the fluid handling system 200 per unit time, e.g., a time table. Such time table is disclosed in United States patent application publication no. US 2007070315, the contents of which are hereby incorporated in their entirety by reference.

As discussed above, the source(s) of electromagnetic radiation of the heating system 207 may employ one or more lasers. However, the heating system 207 of the invention may contain other suitable sources of electromagnetic radiation, such as, but not limited to one or more LEDs or a heating element, etc., which may be configured to provide electromagnetic radiation in a wavelength absorbed by the liquid. Examples of a heating element will be discussed in more details below. Those suitable sources of electromagnetic radiation may be configured and operated in a similar way to the laser or the laser source. The electromagnetic radiation may be infrared light, as well as microwave radiation or even UV light, as long as the electromagnetic radiation is absorbed primarily in the liquid and not or hardly in the substrate W and/or in the photo-resist. An LED, such as an infrared high power LED, may be a suitable source of electromagnetic radiation with a narrow bandwidth for the purpose of heating the liquid. This may be useful, for example, for the purpose of the pulsed mode illumination.

Figure 4:
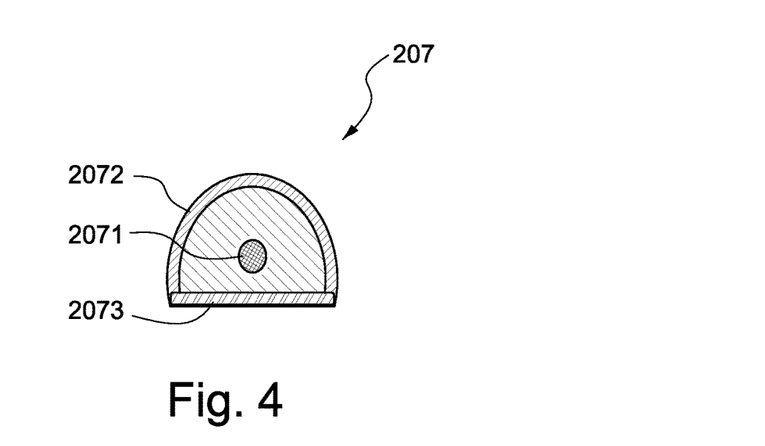
FIG. 4 is an alternative heating system for use in the part of the part of the immersion lithographic apparatus of FIG. 1 according to an embodiment of the invention.

Alternatively, the heating system 207 in the embodiment of FIG. 1 may be replaced with a heating system as shown in FIG. 4. The heating system 207 may be positioned to replace or be used in addition to the gas knife positioned in the fluid handling system 200 which is employed in some conventional fluid handling systems as disclosed in, for example, US 2006038968, US 2006158627, US 2008212046, US 2010313974, US 2011090472, US 2012120376 US 2013016332 and US 2013016333. The heating system 207 may comprise a heating element 2071, a reflector 2072 and a filter 2073. In an embodiment, the heating element 2071 may be a heating wire (such as resistance wire) or an IR heater and may be configured to provide suitable electromagnetic radiation. The reflector 2072 may be positioned above and around the heating element 201 and configured so as to reflect almost all heat generated by the heating element 2071 towards the liquid. The reflector 2072 may have a curved or an arc shape (such as parabolic or elliptic) and a coating (such as gold plated). The filter 2073 may be connected to the reflector 2072 so that the reflector 2072 and the filter 2073 form a small chamber and enclose the heating element 2071. The filter 2073 may be configured such that it only allows the required wavelength to pass therethrough so that the electromagnetic radiation emitting from the heating element 2071 through the filter 2073 primarily heats up the liquid and not the substrate W and/or the photo-sensitive layer. In an embodiment, the heating system 207 may be combined with some additional insulation and cooling such that the heat generated by the heating system 207 does not propagate to other parts of the fluid handling system 200. Again, using the heating element 2071 may be advantageous because heating along a line instead of a spot may be implemented more compactly as compared to using a laser with lenses. In addition, including the reflector 2072 and the filter 2073 may further increase design flexibility for the heating system 207.

Alternatively or additionally, in an embodiment, the fluid handling system 200 may be configured such that a heated liquid is locally supplied to a proximity of the receding contact line 212. For example, the heated liquid may be supplied through liquid outlets 205 in FIGS. 1 and 2, while the liquid having a normal operating temperature of the immersion lithographic apparatus is supplied through openings 203, 204. The heated liquid may be the same as the liquid used for exposure. Alternatively, additional liquid outlets (not shown in the figures) which are configured to locally supply the heated liquid may be provided on the under surface 209 in close proximity to the receding contact line 212. In this fashion this arrangement of locally providing the heated liquid to the proximity of the receding contact line 212 may work similar to the heating system 207 described previously. It is noted that liquid outlets 205 and/or the additional liquid outlets should be well-designed so that the heated liquid does not reach the exposure area. Fluid outlets 206 may preferentially extract the heated liquid, such that the region of the receding contact line 212 is at a higher temperature than the volume 11 under the projection system PS. Possible benefit of using the locally heated liquid would be that no electromagnetic radiation source is required and thus no beam delivery system and no related control system of any kind are needed.

Alternatively or additionally, the entire immersion lithographic apparatus may be heated to a temperature higher than the normal operating temperature of the immersion lithographic apparatus. For example, the entire lithographic apparatus may be kept at a temperature such as 300K, 310K, 320K, 340K. Alternatively, the liquid from openings 203, 204 may be heated so that the temperature of the liquid in the volume 11 is higher, which in turn, results in reduction in viscosity. Possible benefit of both arrangements would be that no control would be required. That means the thermostat of the entire immersion lithographic apparatus would "simply" be set higher, as opposed to heating a specific location (i.e., the receding contact line 212) in a tightly controlled fashion.

Alternatively or additionally, in an embodiment, the heating system 207 is configured to provide a heated gas jet from the under surface 209 of the fluid handling system 200 in a region of the periphery edge of the volume 11 in contact with the substrate W, where the substrate W is receding from the volume 11 along the direction of movement of the substrate W relative to the fluid handling system 200, such the scanning direction of the substrate W (arrow 299) or the stepping direction, i.e., the receding contact line 212 of the volume 11 with the substrate W with respect to the fluid handling system 200. The heated gas jet may be provided in a different form (but not limited to), such as from a gas knife, slot jet, discrete air-jets, etc. For example, the heated gas jet may be provided through a series of holes (or slits) arranged radially outwards of the fluid outlets 206 (not shown in the figures). The holes (or the slits) may be connected to a heated gas source outside of the liquid handing system 200 (not shown in figures). Alternatively, a plurality of heaters may be positioned in channel(s) connecting the holes (or the slits) to a gas source, around the channel(s) (not shown in the figures).

Under some operating conditions, using the heated gas jet may be advantageous because a heated gas jet may typically heat the substrate W less than the laser and therefore transfer less heat to the receding contact line 212 than the laser. However, the heated gas jet should be carefully configured and arranged such that the heated gas jet 1) does not heat the substrate W too much with hot gas and; 2) minimises the leakage of the hot gas to the environment, which may disturb sensor readings of a positioning measurement system. A conventional positioning measurement system has been described in, for example US2010134769, the contents of which are hereby incorporated in their entirety by reference.

The advantage of a combination of the heating system 207 with the gas knife may be that the gas knife reduces the liquid film thickness, thereby reducing the required heating power on the liquid film. For such a fluid handling system, the heating system 207 may be a heater (such as an IR heater) which may be positioned near the gas knife. Using the IR heater may be advantageous because heating of the liquid is more efficient than using the heated gas jet. However, using an IR heater may be undesirable if any of the substrate components (such as metal structures) strongly absorbs the radiation. In this case non-radiative heat sources such as the heated gas jet or the heated liquid described previously may be used.

In an embodiment, the immersion lithographic apparatus may further comprise a detector 208 configured to detect a location of the receding side of the periphery edge of the volume 11 in contact with the substrate W with respect to the fluid handling system 200, i.e., the receding contact line 212 of the volume 11 with the substrate W with respect to the fluid handling system 200. In an embodiment, the immersion lithographic apparatus may further comprise a plurality of detectors 208. The one or more detectors 208 may be arranged, for example, in the under surface 209 of the fluid handling system 200 radially outwards of the fluid outlets 206. The shape of an arrangement of the plurality of detectors 208 may generally correspond to the shape formed by the plurality of fluid outlets 206. Preferably, each detector 208 should be arranged as close to its corresponding heating system 207, e.g. electromagnetic radiation, as possible, e.g., adjacent its corresponding laser, as this may ensure that the laser can heat the precise location of the receding contact line 212. In an embodiment, similar to the arrangement of the corner source of electromagnetic radiation 207C (such as corner laser) in FIG. 2, the fluid handling system 200 may comprise a respective corner detector 208C at each respective corner of the polygonal shape.

In an embodiment, the detector 208 may be a camera which takes images from the under surface 209 of the fluid handling system 200. Alternatively, the detector 208 may be an optical device which comprises a light emitting part and a light receiving part (not shown in figures). The detector 208 may be configured such that the light receiving part receives a signal emitted from the light emitting part at the receding contact line 212. Other suitable detectors may include a reflectivity sensor, a spectrometric sensor, capacitive sensor or a deflection/displacement sensor.

Although the use of the detector 208 is optional when the heating system 207 acts as a self-controlling heating system as described in the previous paragraphs, using the detector 208 may still provide useful information concerning, for example, a precise location of the receding contact line 212 of the volume 11 with substrate W with respect to the fluid handling system 200, at which to direct the heat, the required/optimal laser intensity or duty cycle to be used to generate the minimal amount of heat to effectively increase the scan speed.

In an embodiment, the detector 208 may be positioned in or at the support 100 when the corresponding heating system 207, e.g., a laser, is positioned in or at the support 100. In an embodiment, the immersion lithographic apparatus may further comprise a plurality of detectors 208 in the support 100. As described in the previous paragraph, each detector 208 should preferably be arranged as close to its corresponding heating system 207, e.g., electromagnetic radiation, as possible, e.g., adjacent its corresponding laser. In this embodiment, it is preferred that the detector 208 employs the optical device and works in the same way as described previously because the camera may not be able to take images through the substrate W. In the latter case, it should be noted that the wavelength of the optical device should also be selected such that the signal emitted from the light emitting part of the optical device is hardly absorbed in the substrate W and/or the photo-resist and/or does not expose the photo-resist.

In an embodiment, similar to the arrangement of having one or more lasers around the perimeter of the substrate W as shown in FIG. 1A, one or more detectors 208 may be arranged around the perimeter of the substrate W as close, e.g., adjacent, to its corresponding heating system 207 as possible. The arrangement of the one or more detectors 208 around the perimeter of the substrate W is, however, optional.

In an embodiment, the controller 300 is configured to activate the heating system 207, e.g., source(s) of electromagnetic radiation such as laser(s) and laser source(s), or heated gas jet, in response to a detecting signal from the detector 208, the signal being representative of the detector 208 having detected the location of the receding contact line 212 of the volume 11 with respect to the fluid handling system 200. In an embodiment, the controller 300 may make use of the detected signal to control parameters of the source(s) of electromagnetic radiation such as the intensity of the electromagnetic radiation generated by the specific source of electromagnetic radiation based on the detected signal indicating the position of the receding contact line 212 with respect to the fluid handling system 200. In an embodiment, the controller 300 may control the direction of the electromagnetic radiation, generated by the specific source of electromagnetic radiation, relative to a reference direction, e.g., substantially perpendicular to the substrate W, in response to the detected signal from the detector 208. That is to say, the controller 300 may actuate the source of electromagnetic radiation so that the source is properly guided to focus on the precise location of the receding contact line 212 of the volume 11 with respect to the fluid handling system 200. In an embodiment, the controller 300 may control the duty cycle of a pulsed mode operation of the specific source of electromagnetic radiation, which may be in response to the detected signal indicating the position of the receding contact line 212 with respect to the fluid handling system 200. In an embodiment, the controller 300 may control the source of electromagnetic radiation in response to the detected signal indicating the size of the area of the receding contact line 212 illuminated by the electromagnetic radiation generated by the specific source of electromagnetic radiation, i.e., the controller 300 may actuate the laser so that the source is properly guided to focus on the precise location of the receding contact line of the volume 11.

Again, although the use of the controller 300 is optional when the heating system 207 acts as a self-controlling heating system as described in the previous paragraphs, using the controller 300 may still provide benefits such as those when using the detector 208.

Figure 5:
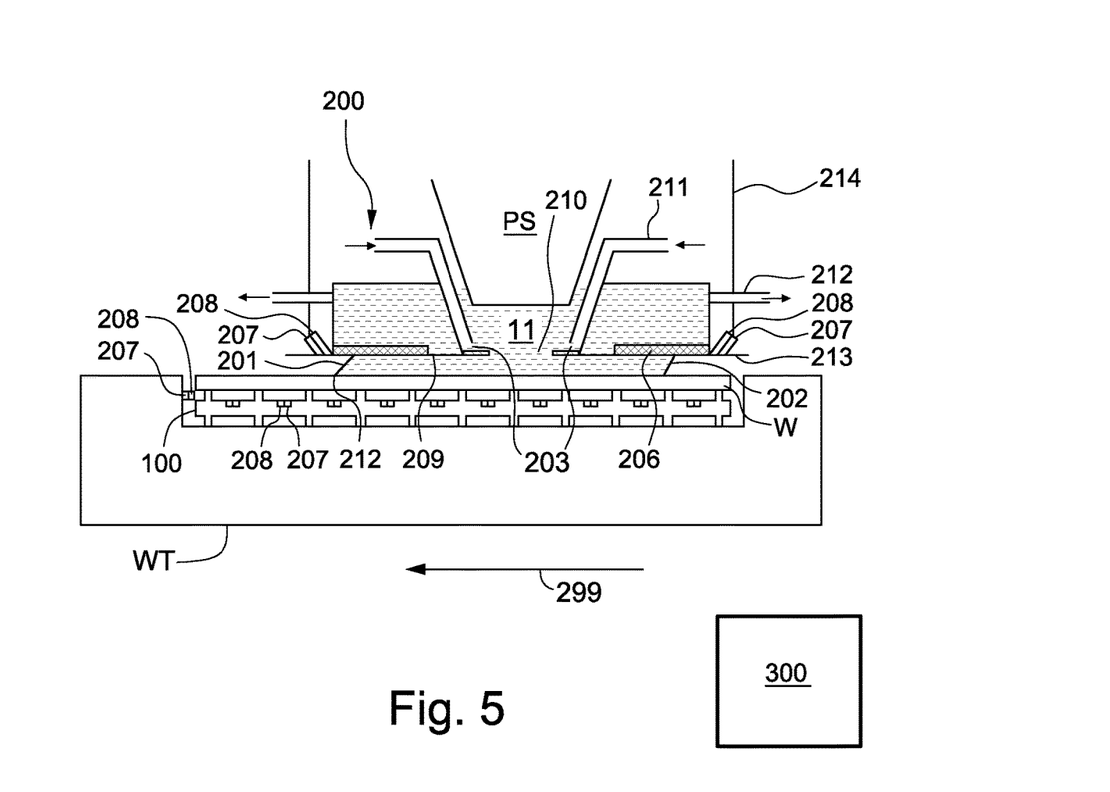
FIG. 5 is a schematic drawing depicting a part of an immersion lithographic apparatus having an alternative fluid handling system according to an embodiment of the invention.

FIG. 5 is a schematic drawing depicting a part of an immersion lithographic apparatus having an alternative fluid handling system 200 according to an embodiment of the invention. FIG. 5 is the same as FIG. 1 except as described below. The fluid handling system 200 of FIG. 5 is conventional and is disclosed in, for example, United States patent application publication no. US 2010045949, the contents of which are hereby incorporated in their entirety by reference. The volume 11 of liquid is provided through openings 203 via liquid supply pipes 211 connected to a liquid supply system (not shown in figures) and is restricted by the substrate W, the fluid handling system 200, and a free surface 201, 202 of the liquid. The free surface 201, 202 extends between the substrate W and the fluid handling system 200. The liquid is extracted from liquid recovery pipes 212 by a negative pressure through fluid outlets 206 on the under surface 209 of the fluid handling system 200. The fluid outlets 206 comprise a porous member having a plurality of holes.

Because there is limited space on the under surface 209 of the fluid handling system 200, the heating system 207 and the detector 208 (optional) may be arranged in the support 100 and operate in the same way as described with respect to the embodiments of FIGS. 1, 1A, 2 and 3. Alternatively or additionally, the fluid handling system 200 may be provided with an extension 213 projecting, such as substantially parallel to the substrate W, from the under surface 209 and arranged radially outwards of the fluid outlets 206 with respect to the central opening 201. The heating system 207 and the detector 208 (optional) may be arranged on or at the extension 213. Preferably, the electromagnetic radiation emitting from the heating system 207 may be oriented at an angle with respect to the extension 213 and/or the substrate W, i.e., not perpendicular to the extension 213 and/or the substrate W. Similarly, the detector 208 may be oriented at an angle with respect to the extension 213 and/or the substrate W. For example, the angle may be controlled by an actuator controlled by the controller 300 so that the electromagnetic radiation emitting from the heating system 207 may reach the receding contact line 212 of the volume 11 with the substrate W. Similarly, the angle of the detector 208 may be controlled by the same or a different actuator controlled by the controller 300 so that the detector 208 may be trimmed to the receding contact line 212 of the volume 11 with the substrate W.

As described previously with respect to the embodiments of FIGS. 1 and 2, the heating system 207 may be replaced by an optical fibre 214 connected to the external source of electromagnetic radiation at one end (not shown in the figures) and positioned in the extension 213 at the other end. The optical fibre 214 may be actuated such that the beam of the electromagnetic radiation (such as laser radiation) may be directed to different locations on the substrate W and the actuation of the optical fibre may be controlled by the controller 300. Similar arrangement may be made for the detector 208 by using an additional or the same optical fibre 214. For the heating system 207 described in FIG. 4, the heating system 207 may be positioned at the extension 213 and operates in the same way as described previously.

Figure 7:
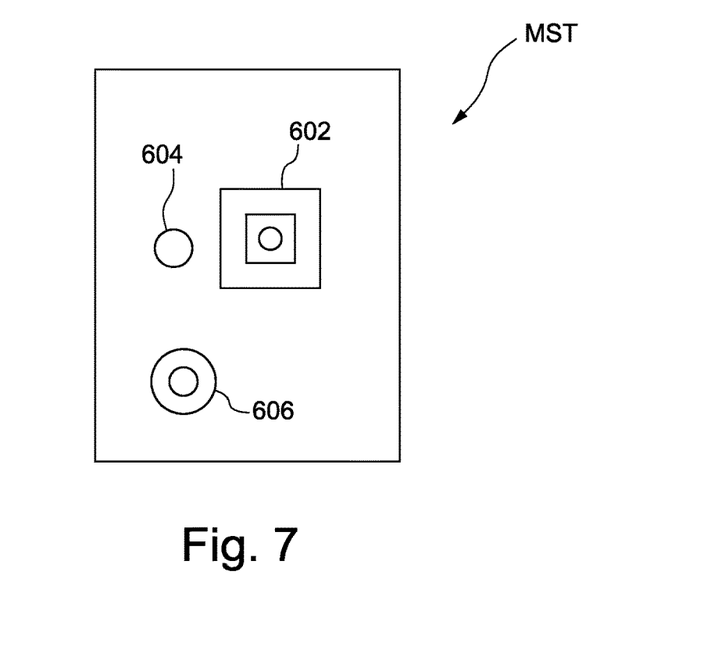
FIG. 7 is a top view of the measurement table in FIG. 6.

As discussed above, the heating system 207 may be used to locally heat the receding contact line 212 formed between the fluid handling system 200 and the substrate W. However, the heating system 207 of the invention may be equally used to locally heat a receding contact line 212 formed between the surface of the moveable object (other than the substrate W) and the fluid handling system 200. Again, as discussed previously, the object may be, for example (but not limited to), the sensor mounted on the moveable table or the top surface of the moveable table, etc. FIG. 6 is the same as FIG. 1 except as described below. In an embodiment, as shown in FIGS. 6 and 7, the moveable table may be the measurement table MST configured to condition optical properties (such as uniformity, dose, aberration and aerial image) of the beam of radiation provided by the projection system PS. A conventional measurement table MST has been described in, for example US2008088843, the contents of which are hereby incorporated in their entirety by reference. The measurement table MST may, for example, include any one or more of an irregular illuminance sensor 602, an aerial image measuring instrument 604, and a wavefront aberration measuring instrument 606 mounted thereon. Other measurement members such as a transmittance measuring instrument which measures a transmittance of projection system PS, and/or a measuring instrument which observes the liquid or the projection system may also be used.

The irregular illuminance sensor 602 has a pinhole-shaped light-receiving section which receives the beam of radiation on an image plane of projection system PS. The irregular illuminance sensor 602 enables measurements of the real intensity and distribution of the beam of radiation on an exposed surface of the substrate W in a very simple manner and at any desired points in time. The aerial image measuring instrument 604 is configured to measure an aerial image (projected image) of the patterned beam of radiation which is projected by the projection system PS. The wavefront aberration measuring instrument 606 is configured to measure a wavefront aberration. The measurements of the irregular illuminance sensor 602, the aerial image measuring instrument 604 and the wavefront aberration measuring instrument 606 are conducted via the same liquid used for exposing the substrate W.

As discussed previously, a hydrophobic surface (such as the surface of the sensor mounted on the measurement table MTS which may be illuminated through the liquid) has a higher contact angle to the liquid and therefore allows a higher critical scan speed than a more hydrophilic surface. For example, the aerial image measuring instrument 604 may be coated with a hydrophobic coating on its surface. However, it is known that the hydrophobic coating may deteriorate as a result of being exposed to the beam of radiation from the projection system PS over a short period of time. When the measurement table MST moves under the fluid handling system 200 at the same scan speed as for exposing the substrate W such that the receding contact line 212 is in contact with the surface of the aerial image measuring instrument 604, it may be possible that such scan speed may already exceed the critical scan speed for the surface of the aerial image measuring instrument 604, resulting in liquid loss on the surface. A heating system similar to the embodiments of FIGS. 1 to 5 may be employed to locally heat a portion of the liquid at a receding contact line 212 of the volume 11 with the surface of the object, e.g., the aerial image measuring instrument 604, where the object is receding from the volume 11 along a direction of movement of the object relative to the fluid handling system 200. The heating system 207 may operate in the same manner as previously described. This may prevent possible liquid loss on the surface of the aerial image measuring instrument 604 in case the hydrophobic coating does deteriorate because the critical scan speed for that particular surface has been increased as a result of the heating of the receding contact line 212. This may also prolong the use of the aerial image measuring instrument 604 and therefore reduce machine down time. Similarly, the detector 208, although optional, may operate in the same manner as previously described. In addition, the fluid handling system 200 of FIG. 6 may be replaced with the one in FIG. 1.

In an embodiment, there is provided an immersion lithographic apparatus, the immersion lithographic apparatus configured to subject a photo-sensitive layer on a substrate to a patterned beam of radiation via a liquid, the immersion lithographic apparatus comprising: a moveable object having a surface; a fluid handling system for controlling a presence of the liquid in a volume restricted by the surface, the fluid handling system, and a free surface of the liquid, the free surface extending between the surface and the fluid handling system; and a heating system configured to locally heat a portion of the liquid at a receding side of a periphery edge of the volume in contact with the surface, where the object is receding from the volume along a direction of movement of the object relative to the fluid handling system.

In an embodiment, the heating system comprises one or more sources of electromagnetic radiation, each respective one of the one or more sources of electromagnetic radiation is configured to generate respective electromagnetic radiation, and the respective electromagnetic radiation is configured to be absorbed predominantly by the liquid, rather than by the object and/or by the photo-sensitive layer. In an embodiment, at least a particular one of the one or more sources of electromagnetic radiation is mechanically coupled to the fluid handling system. In an embodiment, the one or more sources of electromagnetic radiation are arranged along a path of a polygonal shape radially outwards of a plurality of fluid outlets with respect to a central opening of the fluid handling system, the plurality of fluid outlets arranged in an under surface of the fluid handling system and configured to extract a mixture of the liquid and gas. In an embodiment, the immersion lithographic apparatus further comprises an additional source of electromagnetic radiation arranged at a corner of the polygonal shape. In an embodiment, the one or more sources of electromagnetic radiation are arranged at an extension projecting from an under surface of the fluid handling system and arranged radially outwards of a plurality of fluid outlets with respect to a central opening of the fluid handling system. In an embodiment, the one or more sources of electromagnetic radiation are configured such that the receding side of the periphery edge is prevented from moving beyond the electromagnetic radiation emitting from the one or more sources of electromagnetic radiation so as to form a self-controlling heating system. In an embodiment, the heating system is positioned at a fixed location relative to the fluid handling system at a predetermined distance. In an embodiment, the heating system comprises a heating element, a reflector and a filter, the heating element is configured to provide electromagnetic radiation, the reflector is shaped and configured to reflect almost all heat generated by the heating element towards the liquid, and the filter is configured such that the electromagnetic radiation emitting from the heating element through the filter primarily heats up the liquid and not the object and/or the photo-sensitive layer. In an embodiment, the immersion lithographic apparatus comprises a support for supporting the object; and at least a particular one of the one or more sources of electromagnetic radiation is mechanically coupled to the support. In an embodiment, the immersion lithographic apparatus further comprises additional one or more sources of electromagnetic radiation arranged around the perimeter of the object to supply additional heat to the liquid so as to avoid liquid loss at a gap formed between an outer edge of the object and a substrate table supporting the support. In an embodiment, at least a specific one of the one or more sources of electromagnetic radiation is controllable with respect to at least one of: an intensity of the electromagnetic radiation generated by the specific source of electromagnetic radiation; a direction of the electromagnetic radiation, generated by the specific source of electromagnetic radiation, relative to a reference direction substantially perpendicular to the object; a duty cycle of a pulsed mode operation of the specific source of electromagnetic radiation; and a size of an area of the receding side of the periphery edge illuminated by the electromagnetic radiation generated by the specific source of electromagnetic radiation. In an embodiment, the source of electromagnetic radiation is configured to emit a pulsed mode illumination. In an embodiment, the heating system is configured to provide a heated gas jet from an under surface of the fluid handling system in a region of the receding side of the periphery edge, the under surface facing the object. In an embodiment, the immersion lithographic apparatus further comprises a detector configured to detect a location of the receding side of the periphery edge. In an embodiment, the immersion lithographic apparatus further comprises a controller configured to activate the heating system in response to a detecting signal from the detector, the signal being representative of the detector having detected the location of the receding side of the periphery edge. In an embodiment, the fluid handling system is configured such that a heated liquid is locally supplied to a proximity of the periphery edge.

In an embodiment, there is provided a method for processing a substrate in an immersion lithographic apparatus, comprising: subjecting a photo-sensitive layer on a substrate to a patterned beam of radiation via a liquid; controlling a presence of the liquid in a volume restricted by a surface of a moveable object, a fluid handling system, and a free surface of the liquid, the free surface extending between the surface and the fluid handling system; and locally heating a portion of the liquid at a receding side of a periphery edge of the volume in contact with the surface, where the object is receding from the volume along a direction of movement of the object relative to the fluid handling system.

In an embodiment, the heating is provided by one or more sources of electromagnetic radiation, each respective one of the one or more sources of electromagnetic radiation is configured to generate respective electromagnetic radiation, and the respective electromagnetic radiation is configured to be absorbed predominantly by the liquid, rather than by the object and/or by the photo-sensitive layer. In an embodiment, at least a specific one of the one or more sources of electromagnetic radiation is controllable with respect to at least one of: an intensity of the electromagnetic radiation generated by the specific source of electromagnetic radiation; a direction of the electromagnetic radiation, generated by the specific source of electromagnetic radiation, relative to a reference direction substantially perpendicular to the substrate; a duty cycle of a pulsed mode operation of the specific source of electromagnetic radiation; and a size of an area at the free surface illuminated by the electromagnetic radiation generated by the specific source of electromagnetic radiation. In an embodiment, the source of electromagnetic radiation is configured to emit a pulsed mode illumination. In an embodiment, the heating is provided by a heated gas jet. In an embodiment, the method further comprises heating the perimeter of the object to supply additional heat to the liquid so as to avoid liquid loss at a gap formed between an outer edge of the object and a substrate table for supporting a support and the object. In an embodiment, the heating is configured such that the receding side of the periphery edge is prevented from moving beyond the electromagnetic radiation so as to form a self-controlling heating system. In an embodiment, the heating is provided by a heated liquid. In an embodiment, the method further comprises detecting a location of the receding side of the periphery edge. In an embodiment, the method further comprises activating the heating in response to a detecting signal representative of having detected the location of the receding side of the periphery edge.

The term "projection system" used herein should be broadly interpreted as encompassing any type of projection system as appropriate for the radiation wavelength being used, or for other factors such as the use of an immersion liquid.

The terms "radiation" and "beam" used herein encompass all types of electromagnetic radiation, including ultraviolet (UV) radiation (e.g. having a wavelength of or about 436, 405, 365, 248, 193, 157 or 126 nm).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. A skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of photo-resist to a substrate and develops the exposed photo-resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the space (or an outlet from a fluid handling system) or an outlet out of the space (or an inlet into the fluid handling system). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to the skilled person that modifications may be made to the invention as described without departing from the scope of the claims set out below.

The invention claimed is:

1. An immersion lithographic apparatus, the immersion lithographic apparatus configured to subject a photo-sensitive layer on a substrate to a patterned beam of radiation via a liquid, the immersion lithographic apparatus comprising:
    a fluid handling system configured to control a presence of the liquid in a volume restricted by a surface of a moveable object, the fluid handling system, and a free surface of the liquid, the free surface extending between the surface and the fluid handling system; and
    a heating system configured to locally heat a portion of the liquid in the free surface on a receding side of a periphery edge of the volume in contact with the surface of the moveable object, where the object is receding from the volume along a direction of movement of the object relative to the fluid handling system.

2. The immersion lithographic apparatus of claim 1, wherein:
the heating system comprises one or more sources of electromagnetic radiation;
each respective one of the one or more sources of electromagnetic radiation is configured to generate respective electromagnetic radiation; and
the respective electromagnetic radiation is configured to be absorbed predominantly by the liquid, rather than by the object and/or by the photo-sensitive layer.

3. The immersion lithographic apparatus of claim 2, wherein at least a particular one of the one or more sources of electromagnetic radiation is mechanically coupled to the fluid handling system.

4. The immersion lithographic apparatus of claim 2, wherein the one or more sources of electromagnetic radiation are arranged along a path of a polygonal shape radially outwards of a plurality of fluid outlets with respect to a central opening of the fluid handling system, the plurality of fluid outlets arranged in an under surface of the fluid handling system and configured to extract a mixture of the liquid and gas.

5. The immersion lithographic apparatus of claim 4, further comprising an additional source of electromagnetic radiation arranged at a corner of the polygonal shape.

6. The immersion lithographic apparatus of claim 2, wherein the one or more sources of electromagnetic radiation are arranged at an extension projecting from an under surface of the fluid handling system and arranged radially outwards of a plurality of fluid outlets with respect to a central opening of the fluid handling system.

7. The immersion lithographic apparatus of claim 2, wherein the one or more sources of electromagnetic radiation are configured such that the receding side of the periphery edge is prevented from moving beyond the electromagnetic radiation emitting from the one or more sources of electromagnetic radiation so as to form a self-controlling heating system.

8. The immersion lithographic apparatus of claim 7, wherein the heating system is positioned at a fixed location relative to the fluid handling system at a predetermined distance.

9. The immersion lithographic apparatus of claim 2, further comprising a support configured to support the object, wherein at least a particular one of the one or more sources of electromagnetic radiation is mechanically coupled to the support.

10. The immersion lithographic apparatus of claim 9, further comprising additional one or more sources of electromagnetic radiation arranged around the perimeter of the object to supply additional heat to the liquid so as to avoid liquid loss at a gap formed between an outer edge of the object and a substrate table configured to support the object.

11. The immersion lithographic apparatus of claim 2, wherein:
at least a specific one of the one or more sources of electromagnetic radiation is controllable with respect to at least one selected from:
an intensity of the electromagnetic radiation generated by the specific source of electromagnetic radiation;
a direction of the electromagnetic radiation, generated by the specific source of electromagnetic radiation, relative to a reference direction substantially perpendicular to the object;
a duty cycle of a pulsed mode operation of the specific source of electromagnetic radiation; and/or
a size of an area of the receding side of the periphery edge illuminated by the electromagnetic radiation generated by the specific source of electromagnetic radiation.

12. The immersion lithographic apparatus of claim 2, wherein at least a particular one of the one or more sources of electromagnetic radiation is configured to emit a pulsed mode illumination.

13. The immersion lithographic apparatus of claim 1, wherein the heating system comprises a heating element, a reflector and a filter, wherein the heating element is configured to provide electromagnetic radiation, the reflector is shaped and configured to reflect almost all heat generated by the heating element towards the liquid, and the filter is configured such that the electromagnetic radiation emitting from the heating element through the filter primarily heats up the liquid and not the object and/or the photo-sensitive layer.

14. The immersion lithographic apparatus of claim 1, wherein the heating system is configured to provide a heated gas jet from an under surface of the fluid handling system in a region of the receding side of the periphery edge, the under surface facing the object.

15. The immersion lithographic apparatus of claim 1, further comprising a detector configured to detect a location of the receding side of the periphery edge.

16. The immersion lithographic apparatus of claim 15, further comprising a controller configured to activate the heating system in response to a detecting signal from the detector, the signal being representative of the detector having detected the location of the receding side of the periphery edge.

17. The immersion lithographic apparatus of claim 1, wherein the fluid handling system is configured such that a heated liquid is locally supplied to a proximity of the periphery edge.

18. A method of processing a substrate in an immersion lithographic apparatus, the method comprising:
subjecting a photo-sensitive layer on a substrate to a patterned beam of radiation via a liquid;
controlling a presence of the liquid in a volume restricted by a surface of a moveable object, a fluid handling system, and a free surface of the liquid, the free surface extending between the surface and the fluid handling system; and
locally heating a portion of the liquid in the free surface on a receding side of a periphery edge of the volume in contact with the surface, where the object is receding from the volume along a direction of movement of the object relative to the fluid handling system.

19. The method of claim 18, wherein:
the heating is provided by one or more sources of electromagnetic radiation;
each respective one of the one or more sources of electromagnetic radiation is configured to generate respective electromagnetic radiation; and
the respective electromagnetic radiation is configured to be absorbed predominantly by the liquid, rather than by the object and/or by the photo-sensitive layer.

20. The method of claim 18, wherein the heating is provided by a heated gas jet.

* * * * *